(12) United States Patent
Yakunin et al.

(10) Patent No.: US 9,482,960 B2
(45) Date of Patent: Nov. 1, 2016

(54) PELLICLE FOR RETICLE AND MULTILAYER MIRROR

(71) Applicant: ASML NETHERLANDS B.V., Veldhoven (NL)

(72) Inventors: Andrei Mikhailovich Yakunin, Eindhoven (NL); Vadim Yevgenyevich Banine, Deurne (NL); Erik Roelof Loopstra, Eindhoven (NL); Harmen Klaas Van Der Schoot, Vught (NL); Lucas Henricus Johannes Stevens, Eindhoven (NL); Maarten Van Kampen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 191 days.

(21) Appl. No.: 14/181,076

(22) Filed: Feb. 14, 2014

(65) Prior Publication Data

US 2014/0160455 A1  Jun. 12, 2014

Related U.S. Application Data

(63) Continuation of application No. 13/704,222, filed as application No. PCT/EP2011/054057 on Mar. 17, 2011.

(60) Provisional application No. 61/358,645, filed on Jun. 25, 2010, provisional application No. 61/362,981, filed on Jul. 9, 2010.

(51) Int. Cl.
*G03F 7/20* (2006.01)
*B82Y 10/00* (2011.01)
(Continued)

(52) U.S. Cl.
CPC .............. *G03F 7/702* (2013.01); *B82Y 10/00* (2013.01); *B82Y 40/00* (2013.01); *C01B 31/04* (2013.01);
(Continued)

(58) Field of Classification Search
CPC ....... B82Y 10/00; B82Y 40/00; C01B 31/04; G02B 27/0006; G02B 5/0816; G02B 5/0891; G02B 5/204; G02B 5/208; G03B 27/54; G03F 1/24; G03F 1/62; G03F 7/702; G03F 7/70916; G03F 7/70958; G03F 7/70983; G21K 1/062; G21K 2201/061; H01B 1/04; H01B 1/24
See application file for complete search history.

(56) References Cited

U.S. PATENT DOCUMENTS 6,197,454 B1 * 3/2001 Yan ........................... G03F 1/24
430/5
6,594,334 B1   7/2003 Ota
(Continued)

FOREIGN PATENT DOCUMENTS

CN   1461426 A   12/2003
CN   1495532 A   5/2004
(Continued)

OTHER PUBLICATIONS

International Search Report mailed Nov. 22, 2011 in corresponding International Patent Application No. PCT/EP2011/054057.
(Continued)

*Primary Examiner* — Steven H Whitesell Gordon
(74) *Attorney, Agent, or Firm* — Pillsbury Winthrop Shaw Pittman LLP

(57) ABSTRACT

A pellicle that includes graphene is constructed and arranged for an EUV reticle. A multilayer mirror includes graphene as an outermost layer.

13 Claims, 6 Drawing Sheets

(51) Int. Cl.

| | | |
|---|---|---|
| *B82Y 40/00* | (2011.01) | |
| *C01B 31/04* | (2006.01) | |
| *G02B 5/08* | (2006.01) | |
| *G02B 5/20* | (2006.01) | |
| *G02B 27/00* | (2006.01) | |
| *G03F 1/24* | (2012.01) | |
| *G03F 1/62* | (2012.01) | |
| *G21K 1/06* | (2006.01) | |
| *H01B 1/04* | (2006.01) | |
| *H01B 1/24* | (2006.01) | |
| *G03B 27/54* | (2006.01) | |

(52) U.S. Cl.
CPC .......... *G02B 5/0816* (2013.01); *G02B 5/0891* (2013.01); *G02B 5/204* (2013.01); *G02B 5/208* (2013.01); *G02B 27/0006* (2013.01); *G03B 27/54* (2013.01); *G03F 1/24* (2013.01); *G03F 1/62* (2013.01); *G03F 7/70916* (2013.01); *G03F 7/70958* (2013.01); *G03F 7/70983* (2013.01); *G21K 1/062* (2013.01); *H01B 1/04* (2013.01); *H01B 1/24* (2013.01); *G21K 2201/061* (2013.01)

(56) References Cited

U.S. PATENT DOCUMENTS

| | | | |
|---|---|---|---|
| 6,683,936 | B2 | 1/2004 | Jonkers |
| 7,233,009 | B2 | 6/2007 | Schuurmans et al. |
| 7,297,968 | B2 | 11/2007 | Endo et al. |
| 7,456,932 | B2 | 11/2008 | Bakker et al. |
| 7,612,353 | B2 | 11/2009 | Sjmaenok et al. |
| 7,911,588 | B2 | 3/2011 | Yonekawa et al. |
| 8,018,578 | B2 | 9/2011 | Banine et al. |
| 8,173,975 | B2 | 5/2012 | Jonkers et al. |
| 8,915,775 | B2 | 12/2014 | Ikeda et al. |
| 9,041,905 | B2 | 5/2015 | Ehm et al. |
| 9,395,630 | B2 | 7/2016 | Yakunin et al. |
| 2004/0004779 | A1 | 1/2004 | Kochergin et al. |
| 2005/0042153 | A1* | 2/2005 | Bristol .................. B32B 5/18 422/186.3 |
| 2005/0195376 | A1 | 9/2005 | Schmerek |
| 2006/0160031 | A1 | 7/2006 | Wurm et al. |
| 2007/0284557 | A1 | 12/2007 | Gruner et al. |
| 2008/0123073 | A1 | 5/2008 | Shiraishi et al. |
| 2009/0211210 | A1 | 8/2009 | Engerran et al. |
| 2009/0243637 | A1 | 10/2009 | Okai et al. |
| 2009/0314967 | A1 | 12/2009 | Moriya et al. |
| 2010/0176280 | A1 | 7/2010 | Yokogawa |
| 2010/0255984 | A1* | 10/2010 | Sutter .................... B82Y 30/00 502/185 |
| 2010/0323113 | A1* | 12/2010 | Ramappa ............ C23C 14/0605 427/398.1 |
| 2012/0224153 | A1 | 9/2012 | Ehm et al. |

FOREIGN PATENT DOCUMENTS

| | | |
|---|---|---|
| CN | 1892441 A | 1/2007 |
| EP | 0 532 968 | 3/1993 |
| EP | 1479143 | 11/2004 |
| EP | 2 068 326 | 6/2009 |
| EP | 2 113 809 | 11/2009 |
| JP | 8-321395 | 12/1996 |
| JP | 10-92743 | 4/1998 |
| JP | 11-51576 | 2/1999 |
| JP | 2000-349009 | 12/2000 |
| JP | 2001-170402 | 6/2001 |
| JP | 2004-327213 | 11/2004 |
| JP | 2005-43895 | 2/2005 |
| JP | 2007-531296 | 11/2007 |
| JP | 2007-318100 | 12/2007 |
| JP | 2008-535642 | 9/2008 |
| JP | 2008-258490 | 10/2008 |
| JP | 2008-268956 | 11/2008 |
| JP | 2009-4647 | 1/2009 |
| JP | 2009-243999 | 10/2009 |
| JP | 2010-165718 | 7/2010 |
| JP | 2013-534727 | 9/2013 |
| JP | 2015-18228 | 1/2015 |
| WO | 01/40870 | 6/2001 |
| WO | 02/084406 | 10/2002 |
| WO | 03/062922 | 7/2003 |
| WO | 03/073565 | 9/2003 |
| WO | 2008/048295 | 4/2008 |
| WO | 2008/060465 | 5/2008 |
| WO | 2010/004482 | 1/2010 |
| WO | 2010/015508 | 2/2010 |
| WO | 2011/029761 | 3/2011 |
| WO | 2012/041697 | 4/2012 |

OTHER PUBLICATIONS

Shu Jun Wang et al., "Fabrication of highly conducting and transparent graphene films," Carbon, vol. 48, No. 6, pp. 1815-1823 (May 1, 2010).

A.K. Geim, "Graphene: Status and Prospects," Science, vol. 324, No. 5934, pp. 1530-1534 (Jun. 19, 2009).

A.K. Geim et al., "The rise of graphene," Nature Materials, vol. 6, No. 3, pp. 183-191 (Mar. 2007).

C. Scilletta et al., "Influence of substrate temperature and atmosphere on nano-graphene formation and texturing of pulsed Nd:YAG laser-deposited carbon films," Applied Surface Science, vol. 252, No. 13, pp. 4877-4881 (Apr. 30, 2006).

European Office Action dated Jul. 2, 2013 in corresponding European Patent Application No. 12160749.3.

Final Office Action mailed Nov. 12, 2015 in corresponding U.S. Appl. No. 13/704,222 (10 pages).

Gallagher, Emily E., et al., "Properties and performance of EUVL pellicle membranes", Proceedings of SPIE, Oct. 23, 2015, vol. 9635, pp. 96350X-1-96350X-8.

Zhou, S. Y., et al., "Instability of two-dimensional graphene: Breaking sp2 bonds with soft x rays", Physical Review B, Sep. 29, 2009, vol. 80, pp. 121409-1-121409-4.

Japanese Office Action mailed Aug. 25, 2016 in corresponding Japanese Patent Application No. 2015-210878 (10 pages.).

* cited by examiner

PELLICLE FOR RETICLE AND MULTILAYER MIRROR

CROSS-REFERENCE TO RELATED APPLICATIONS

This application is a continuation application of U.S. patent application Ser. No. 13/704,222, filed Dec. 13, 2012, which is the U.S. national phase entry of International Patent Application No. PCT/EP2011/054057, filed Mar. 17, 2011, which claims the benefit of priority from U.S. Provisional Patent Application No. 61/358,645, filed on Jun. 25, 2010, and U.S. Provisional Patent Application No. 61/362,981, filed on Jul. 9, 2010, all of which are hereby incorporated by reference in their entireties.

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin (Sn)), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In an alternative arrangement a radiation system for producing EUV radiation may use an electrical discharge to generate the plasma. The electrical discharge passes into a gas or vapor such as Xe gas, Li vapor or Sn vapor, generating a very hot plasma which emits EUV radiation. Such a radiation system is typically termed a discharge produced plasma (DPP) source.

Plasma creation within an EUV source may cause contamination particles to be created from the fuel. These contamination particles may move either at relatively fast speeds, in which case they tend to generally follow the path of the radiation beam; or at relatively slow speeds, in which case they are free to undergo Brownian motion. In some lithographic apparatus the relatively slow moving contamination particles may be conveyed by a flow of gas within the lithographic apparatus.

Both the relatively fast moving and relatively slow moving contamination particles may move towards the patterning device of the lithographic apparatus. If the contamination particles reach the patterning device (even in very small numbers) then they may contaminate the patterning device. The contamination of the patterning device may reduce the imaging performance of the lithographic apparatus and may in more serious cases require the patterning device to be replaced. The patterning device can be expensive and therefore any reduction in the frequency with which it must be replaced may be advantageous. Furthermore, replacement of the patterning device is a time consuming process, during which the operation of the lithographic apparatus may have to be stopped. Stopping the operation of the lithographic apparatus may reduce the output of the lithographic apparatus and thereby reduce its efficiency, which is undesirable.

It is desirable to provide a lithographic apparatus which can capture both fast and slow moving contamination particles such that they are less likely to contaminate the patterning device.

According to an aspect of the invention, there is provided a lithographic apparatus that includes a radiation source configured to produce a radiation beam, and a support configured to support a patterning device. The patterning device is configured to impart the radiation beam with a pattern to form a patterned radiation beam. A chamber is located between the radiation source and the support. The chamber contains at least one optical component configured to reflect the radiation beam. The chamber is configured to permit radiation from the radiation source to pass therethrough. A membrane defines part of the chamber. The membrane is configured to permit the passage of the radiation beam through the membrane, and to prevent the passage of contamination particles through the membrane. A particle trapping structure is configured to permit gas to flow along an indirect path from inside the chamber to outside the chamber, the indirect path of the particle trapping structure being configured to substantially prevent the passage of contamination particles from inside the chamber to outside the chamber.

According to an aspect of the invention, there is provided a lithographic method that includes generating a radiation beam, and directing the radiation beam through a chamber containing at least one optical component that reflects the radiation beam. The radiation beam is directed towards a patterning device. The chamber includes a membrane. The method includes preventing the passage of contamination particles with the membrane when the radiation beam passes from the chamber through the membrane and towards the patterning device, flowing gas from inside the chamber to outside the chamber along an indirect path through a particle trapping structure, the indirect path substantially preventing the passage of contamination particles from inside the chamber to outside the chamber, imparting the radiation beam with a pattern to form a patterned radiation beam with the patterning device, and projecting the patterned beam of radiation onto a substrate with a projection system.

According to an aspect of the invention there is provided a lithographic apparatus comprising a radiation source configured to produce a radiation beam and a support configured to support a patterning device, the patterning device being configured to impart the radiation beam with a pattern to form a patterned radiation beam, wherein the support is provided with a pellicle which comprises a layer of graphene.

According to an aspect of the invention there is provided a spectral purity filter comprising a grid configured to prevent or reduce the passage of infrared radiation, wherein the grid is covered with graphene which prevents the passage of oxygen to the grid. The graphene may be provided as one or more layers, or may surround ribs of the grid.

According to an aspect of the invention there is provided a spectral purity filter comprising a grid configured to prevent or reduce the passage of infrared radiation, the grid comprising a tungsten/graphene multi-layered structure.

According to an aspect of the invention there is provided a spectral purity filter comprising a material which blocks out-of-band radiation, wherein the spectral purity filter further comprises a layer of graphene which supports the material.

According to an aspect of the invention there is provided a multi-layer mirror comprising alternating layers of a first material and a second material, wherein graphene is provided between the alternating layers.

According to an aspect of the invention there is provided a multi-layer mirror comprising alternating layers of a first material and a second material, wherein a layer of graphene is provided as an outer layer of the multi-layer mirror.

According to an aspect of the invention there is provided a lithographic apparatus having a graphene membrane which is configured to stop the passage of contamination particles and to transmit EUV radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
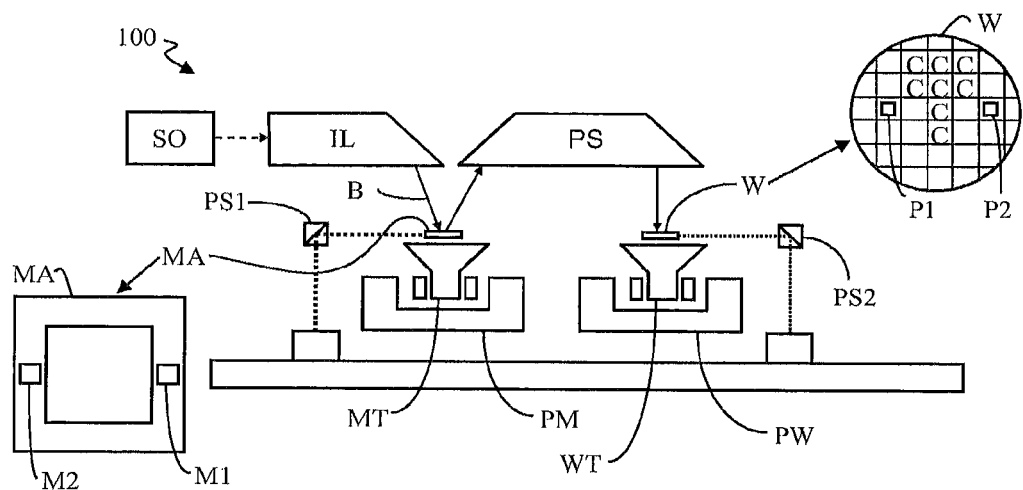
FIG. 1 depicts a lithographic apparatus according to an embodiment of the invention.

FIG. 1 schematically depicts a lithographic apparatus 100 including a source collector module SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g. xenon (Xe), lithium (Li), tin (Sn), gadolinium (Gd) or terbium (Tb) coupled with one or more emission lines in the EUV range (the EUV range is considered to include wavelengths around 13 nm and around 6-7 nm). In one such method, often termed laser produced plasma ("LPP") the required plasma can be produced by irradiating a fuel with a laser beam. The fuel may for example be a droplet, stream or cluster of material having the required line-emitting element. The source collector module SO may be part of an EUV radiation system including a laser, not shown in FIG. 1, for providing the laser beam which excites the fuel. The resulting plasma emits output radiation, e.g. EUV radiation, which is collected using a radiation collector located in the source collector module. The laser and the source collector module may be separate entities, for example when a $CO_2$ laser is used to provide the laser beam for fuel excitation. In such cases, the laser is not considered to form part of the lithographic apparatus, and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
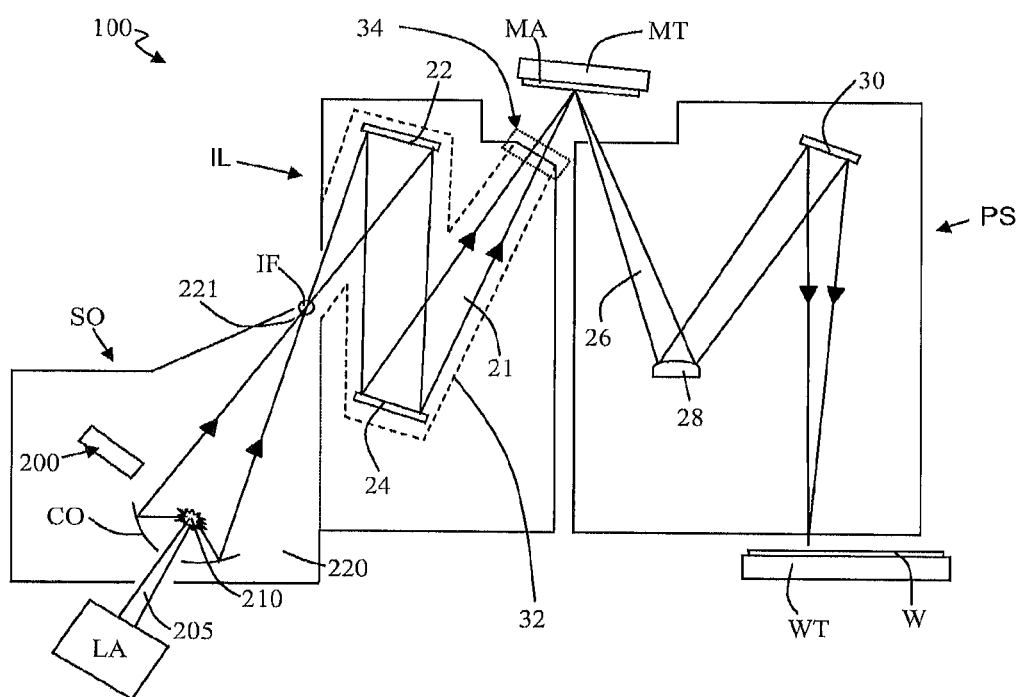
FIG. 2 is a view of a laser produced plasma source collector module of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO.

A laser LA is arranged to deposit laser energy via a laser beam 205 into a fuel, such as xenon (Xe), tin (Sn) or lithium (Li) which is provided from a fuel supply 200, thereby creating a highly ionized plasma 210 with electron temperatures of several 10's of eV. The energetic radiation generated during de-excitation and recombination of these ions is emitted from the plasma, collected and focussed by a near normal incidence collector optic CO.

Radiation that is reflected by the collector optic CO is focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210.

Although the source collector module SO shown in FIG. 2 comprises an LPP source, the source collector module may comprise any suitable source and may for example comprise a DPP source. The DPP source may for example be configured to pass an electrical discharge into a gas or vapor such as Xe gas, Li vapor or Sn vapor, generating a very hot plasma which emits EUV radiation. A collector optic such as a grazing incidence collector may be configured to collect the EUV radiation and focus it to an intermediate focus. The intermediate focus may be located at or near an opening in an enclosing structure of the source collector module.

After passing through the intermediate focus IF the radiation traverses the illumination system IL. The illumination system IL may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, a patterned beam 26 is formed and the patterned beam 26 is imaged by the projection system PS via reflective elements 28, 30 onto a substrate W held by the substrate table WT.

More elements than shown may generally be present in the illumination system IL and projection system PS. Further, there may be more mirrors present than those shown in the Figures, for example there may be 1-6 additional reflective elements present in the projection system PS than shown in FIG. 2.

The creation of ionized plasma from fuel not only produces radiation, but also produces unwanted contamination particles. In the case where tin (Sn) is used as fuel, these contamination particles may be produced at a rate of approximately 1000 per second. The contamination particles may have a size of up to about 150 nanometers, and may have a size of up to about 500 nanometers. The contamination particles may have a speed of up to about 100 meters per second, and may have a speed of up to about 1000 meters per second.

Contamination particles produced with different speeds may take different paths from the plasma 210. For example, relatively fast contamination particles may travel in the same direction as the beam of radiation produced by the source collector module SO. Furthermore, some relatively fast contamination particles may strike the collector optic CO and bounce off the collector optic CO such that the particles will also follow the path of the beam of radiation. When the relatively fast moving contamination particles follow the path of the beam of radiation, the contamination particles may bounce off the mirror devices 22, 24 within the illumination system IL so that they reach the patterning device MA.

Relatively slow moving contamination particles may undergo Brownian motion and hence drift through the low pressure environment of the source collector module SO and illuminator module IL towards the patterning device MA. Furthermore, in some lithographic apparatus, such as that shown in FIG. 2, the illuminator module IL and/or source collector module SO may comprise a gas flow conduit 32. The gas flow conduit 32 may have a gas pumped through it so as to reduce molecular contamination within the illumination module IL. Molecular contamination may be the accumulation of molecules (or products of the dissociation of these molecules caused by the radiation beam) on the surfaces of reflectors (or other optical components) within the lithographic apparatus. The molecules may originate from within the lithographic apparatus itself. For example, the molecules may originate from the components of the lithographic apparatus, from lubricants used within the lithographic apparatus or from electronic systems within the lithographic apparatus. The gas pumped through the gas conduit 32 may be atomic hydrogen. In some embodiments, the gas may be pumped into the gas conduit 32 so that the gas travels in a direction towards the patterning device MA. In this case, the movement of the gas through the gas conduit 32 may carry relatively slow contamination particles with it towards the patterning device MA.

In some lithographic apparatus, if contamination particles reach the patterning device MA (even in small numbers which are less than 1 particle per hour), then this may have a detrimental effect on the imaging performance of the lithographic apparatus. If the patterning device MA becomes contaminated with contamination particles, it may be necessary to replace or clean the patterning device MA. In order to replace or clean the patterning device MA it may be necessary to stop the operation of the lithographic apparatus. Any downtime of the lithographic apparatus would result in a decrease in the output of the lithographic apparatus and hence reduce the profitability of the lithographic apparatus. It will be appreciated that any reduction in the profitability of the lithographic apparatus may be undesirable.

Figure 3:
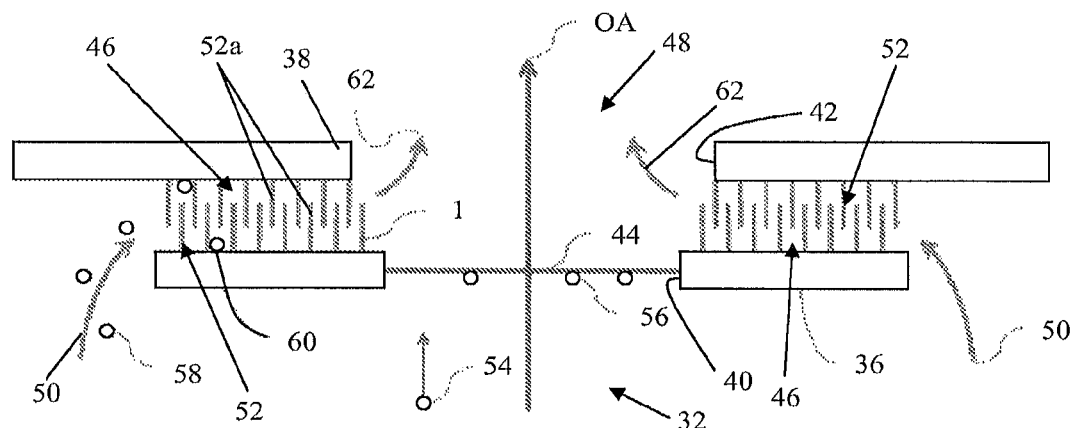
FIG. 3 is view of a membrane and particle trapping structure according to an embodiment of the present invention.

FIG. 3 shows a schematic cross section through a portion of the lithographic apparatus indicated by 34 in FIG. 2. The portion of the lithographic apparatus shown in FIG. 3 is capable of preventing both fast moving and slow moving contamination particles from reaching the patterning device MA. The portion of the lithographic apparatus shown in FIG. 3 comprises first and second wall members 36, 38 which define part of the gas conduit 32. The first and second wall members 36, 38 comprise respective openings 40, 42. The openings 40, 42 share a common axis which is the optical axis OA of the beam of radiation 21 of the lithographic apparatus. The opening 40 in the first wall member 36 comprises a gas-tight membrane 44 which is secured across the opening 40 so as to prevent the passage of gas from one side of the first wall member 36 to the other side of the first wall member 36 via the opening 40.

The first and second wall members 36, 38 are spaced from one another such that there is at least one gas flow path between them. In the embodiment shown in FIG. 3 there are two gas flow paths 46, one either side of the optical axis OA. The gas flow paths 46 allow gas to flow from inside the gas conduit 32 to outside the gas conduit 32 (outside the gas conduit 32 is indicated generally by 48). The path of gas from inside the gas conduit 32 to outside 48 the gas conduit is indicated generally by the arrows 50. The gas flow paths 46 are defined by particle trapping structures 52. The particle trapping structures 52 comprise a plurality of plates 52a. The plates 52a extend in a direction parallel to the optical axis OA and extend alternately from the first wall member 36 and the second wall member 38. The plates 52a are spaced from one another and extend in an interdigitated manner so that they overlap in a direction perpendicular to the optical axis OA. The plates 52a of the particle trapping structures 52 therefore ensure that there is no line of sight path for gas to flow from inside the gas conduit 32 to outside 48 the gas conduit 32. The plates 52a confine gas flow through the particle trapping structure 52 such that it follows an indirect path. In this case the indirect path is a meandering one, i.e. the path changes direction multiple times as it progresses towards outside 48 the gas conduit 32. For example, the path may change direction at least four times as it progresses towards outside 48 the gas conduit 32. The changes in direction of the path may be abrupt. In the present embodiment, the meandering path is boustrophedonic, meaning that the gas flows in one direction and then turns to go in the opposite direction whilst it progresses towards outside 48 the gas conduit 32. In an embodiment where the length of each plate 52a (parallel to the optical axis OA in use) is approximately 10 times the separation between adjacent plates 52a, such a pair of adjacent plates may prevent approximately 90% of the contamination particles from passing between the adjacent pair of plates. In some embodiments, it may be advantageous for the particle trapping structure to reduce the level of contamination particles by 6 or 7 orders of magnitude. In these embodiments it may be desirable to use at least 5 pairs of adjacent plates (i.e. 10 plates). It will be appreciated that any appropriate number of plates may be used. For example, there may be between 2 and 100 plates. In some embodiments, the use of curved plates (i.e. plates where there is no line of sight path through the gap between an adjacent pair of plates) may increase the proportion of contamination particles which are prevented from passing between the adjacent pair of plates compared to planar plates. It follows that less pairs of curved plates may be required (compared to planar plates) to prevent a given proportion of contamination particles from passing through the contamination trapping structure.

In use, the openings 40, 42 are arranged within the lithographic apparatus so that the beam of radiation passes through the openings 40, 42, including passing through the membrane 44. The material and thickness of the membrane 44 is chosen so that it permits the radiation beam 21 to pass through it. It will be appreciated that in some embodiments of the invention the membrane 44 may not permit 100% of the incident radiation to pass through it. The thickness and material of the membrane 44 is also chosen so that contamination particles travelling at fast speeds in the direction of the radiation beam 21 can strike the membrane 44 without causing degradation of the membrane 44 to an extent that it becomes no longer gas-tight.

The membrane 44 is also able to withstand the pressure created by the collisions of many fast moving contamination particles with the membrane 44 without the membrane 44 degrading such that it is no longer gas-tight. For example, the membrane may need to withstand a pressure of approximately 1 GPa to 10 GPa created by a Sn particle. It is thought that the rate of collisions may be of the order of about 1000 collisions per second. The size of the fast moving contamination particles may be in the range of approximately 150 nanometers to approximately 1 μm. The particles may be travelling at speeds of approximately 100 meters per second to approximately 1000 meters per second. It will be appreciated that there may be a variety of different sized particles colliding with the membrane 44 at a variety of speeds. Furthermore, the rate of collisions of the fast moving particles of the membrane 44 occur may not be constant with time.

A fast moving contamination particle travelling in the same direction as the radiation beam 21 within the gas conduit 32 is indicated by 54. Fast moving contamination particles which are moving in the same direction as the radiation beam 21 (such as that indicated by 54) collide with the membrane 44 and either become impacted in the membrane 44 (as indicated by 56) or rebound (not shown) from the membrane 44. Fast moving contamination particles which rebound from the membrane 44 may lose energy as they rebound. This loss of energy may cause fast moving contamination particles which rebound off the membrane to become slow moving contamination particles which continue to move within the gas conduit 32. If the fast moving contamination particles become slow moving contamination particles, they may subsequently be trapped within the particle trapping structure 52.

Example membrane materials include zirconium (Zr), molybdenum (Mo), yttrium (Y), silicon (Si), rubidium (Rb), strontium (Sr), niobium (Nb), ruthenium (Ru) and carbon (C). An example of a range of thicknesses of membrane 44 which may be used is about 10 nanometers to about 500 nanometers. For example, the membrane 44 may be about 100 nanometers thick. Another example of a material that may be used to fabricate the membrane is graphene. Depending on at least the strength of the membrane 44 required to withstand collisions with fast moving contamination particles without degrading, a single sheet of graphene may be used. Alternatively, a graphene layer comprising a plurality of graphene sheets or a composite of graphene flakes may be used. It will be appreciated that the membrane 44 may be a single layer of a particular material, or may be multiple layers. The layers may be formed from different materials.

As previously discussed, gas flows through the particle trapping structures 52 from inside the gas conduit 32 to outside the gas conduit 48. The flow of gas from inside the gas conduit 32 to outside 48 the gas conduit may carry with it slow moving contamination particles such as those indicated by 58. Because the gas has to undertake an indirect path through the particle trapping structure 52, the path of the gas from inside the gas conduit 32 to outside 48 the gas conduit is longer than a direct path. The longer indirect flow path (compared to a shorter length direct gas flow path) is defined by a greater surface area of walls defining the indirect gas flow path 46 (in this case a first and second wall members 36, 38 and the plates 52a). This greater surface area of walls defining the indirect gas flow path 46 that the gas is exposed to as it travels along the indirect flow path provides a greater surface area for the slow moving contamination particles within the gas to contact. The increased surface area of the walls defining the indirect flow path increases the likelihood (compared to that of a direct flow path) that the slow moving contamination particles within the gas will contact the walls defining the indirect flow path. When the slow moving contamination particles contact one of the walls defining the indirect gas flow path 46 within the particle trapping structure 52, they may come to rest against the wall. Particles which have come to rest against one of the walls which defines the indirect gas flow path 46 of the particle trapping structure 52 are indicated by 60. Because the slow moving contamination particles are captured by the walls defining the indirect gas flow path 46 of the particle trapping structure 52, the gas which has passed through the particle trapping structure 52 is free from contamination particles (this is indicated by the arrow 62).

As mentioned above, the indirect path of the particle trapping structure 52 changes direction multiple times as it progresses towards outside 48 the gas conduit 32. The changes in direction of the indirect flow path of the particle trapping structure may be abrupt. Abrupt changes in the direction of the indirect path of the particle trapping structure 52 may increase the likelihood that contamination particles will contact the walls which define the indirect gas flow path 46, when the gas undertakes an abrupt change in direction due to the abrupt change in direction of the flow path. By increasing the likelihood that contamination particles will contact the walls which define the indirect gas flow path 46, it is more likely that slow moving contamination particles carried by the gas will come to rest against one of the walls which defines the indirect gas flow path 46 of the particle trapping structure 52. In this way, abrupt changes in the direction of the indirect flow path may increase the likelihood that contamination particles are captured by the walls defining the indirect gas flow path 46 of the particle trapping structure 52. It follows that abrupt changes in the direction of the indirect flow path 46 may reduce the likelihood that contamination particles pass to outside 48 the gas conduit.

It can be seen that the combination of a membrane formed from a material and thickness sufficient to prevent fast moving contamination particles passing through it (and also sufficient to prevent the membrane from becoming non gas-tight), and a particle trapping structure configured to collect slow moving contamination particles will result in a lithographic apparatus which is capable of preventing both fast and slow moving contamination particles from reaching the patterning device MA.

It will be appreciated that the above embodiment of the invention is described by way of example only and that the scope of the invention should not be limited by such an example. It will further be appreciated that various modifications may be made to the embodiment of the invention described above without departing from the scope of the invention.

As previously discussed, the membrane 44 may be constructed of any suitable material that is impermeable to fast moving and slow moving contamination particles. In practice, this is likely to mean that the membrane 44 is gas-tight. However, it is within the scope of the invention that the membrane may be gas permeable, provided that the contamination particles cannot pass through the membrane. The membrane material should be capable of withstanding multiple collisions with fast moving contamination particles so that the ability of the membrane 44 to be impermeable to both fast moving and slow moving contamination particles does not degrade. The membrane material should allow the radiation beam 21 of the lithographic apparatus to pass through it from the radiation source SO to the patterning device MA.

In the described embodiment, the plates 52a of the particle trapping structures 52 are generally planar. It will be appreciated that the plates 52a may have any appropriate shape. For example, the plates may be non-planar and/or curved. The plates may be constructed from any appropriate material. It may be advantageous for the plates 52a to be constructed from a material which is non-reactive in the atmosphere in which the particle trapping structure is used. For example, if the particle trapping structure is used in a hydrogen-rich atmosphere, suitable, non-reactive materials include aluminium (Al), tungsten (W), ruthenium (Ru), molybdenum (Mo), silicon oxide ($SiO_2$), zirconium oxide ($ZrO_2$) and aluminium oxide ($Al_2O_3$).

It will be appreciated that although the indirect gas flow path 46 defined by the particle trapping structures 52 in the described embodiment is meandering (specifically, boustrophedonic), any appropriate structure which creates an indirect gas flow path may be used. For example, the path may be labyrinthine. It will further be appreciated that the particle trapping structure may take any appropriate form. The particle trapping structure should be capable of permitting a flow of gas from inside a chamber (in this case the gas conduit 32) to outside the chamber, whilst at the same time substantially preventing the passage of contamination particles within the gas from inside the chamber to outside the chamber. Another example of a possible particle trapping structure is a sponge-like material which is porous to the gas but impermeable to the contamination particles within the gas. Examples of suitable sponge-like materials include sponge-like materials constructed from metals. It is desirable that the material used to construct the sponge like material is non-reactive in the atmosphere in which the particle trapping structure of which it forms part will be used. For example, if the particle trapping structure (and hence the sponge-like material) is to be used in a hydrogen atmosphere, then appropriate, non-reactive metals include Aluminium (Al), Tungsten (W), ruthenium (Ru) and molybdenum (Mo). The sponge-like material comprises a lattice defining a plurality of cavities. The sponge-like material may permit gas to flow from inside the chamber to outside the chamber along an indirect path. The path of the gas through the sponge-like material is indirect because the gas travels in a non-straight line path through a series of adjacent cavities within the sponge-like material.

It will be appreciated that within the particle trapping structure of the described embodiment, the slow moving contamination particles within the gas become attached to the walls which define the indirect gas flow path 46 through the particle trapping structures 52. The attachment of the contamination particles to the walls defining the indirect gas flow path 46 of the particle trapping structure 52 may be caused by Van der Waals' forces between the contamination particles and the wall members. In some embodiments it may be desirable to coat the particle trapping structure with a substance which improves the ability of the contamination particles to stick to the walls defining the indirect gas flow path 46 of the particle trapping structure 52. For example, the walls may be coated in an adhesive or the like. Also, in some embodiments the particle trapping structures may be heated so as to improve the attachment of contamination particles within the gas to the walls which define the indirect gas flow path 46 of the particle trapping structures 52.

Within the described embodiment, the membrane 44 is adjacent two separate particle trapping structures 52. It will be appreciated that a lithographic apparatus according to the present invention may comprise only one particle trapping structure or alternatively may comprise more than two. Furthermore, any particle trapping structure may be located at a position remote to the membrane.

According to an alternative aspect, it is possible to provide a lithographic apparatus that includes a radiation source, the radiation source configured to produce a radiation beam, a support configured to support a patterning device, the patterning device being configured to impart the radiation beam with a pattern to form a patterned radiation beam, a chamber located between the radiation source and the support (and patterning device when the patterning device is being supported by the support), the chamber containing at least one optical component which is configured to reflect the radiation beam, the chamber being configured to permit radiation from the radiation source to pass through it to the patterning device and a membrane, the membrane being configured to permit the passage of the radiation beam through the membrane, the membrane also being configured to prevent the passage of contamination particles through the membrane, the membrane comprising or being formed of graphene. It is not necessary that the membrane defines part of the chamber, nor is it necessary that the membrane lies in the path of the radiation beam. In such an aspect, the membrane may form a pellicle constructed and arranged to protect the patterning device from particles that form debris. It may also be used as a spectral purity filter.

In the described embodiment the membrane and particle trapping structure are located within the illumination system IL at the end of the gas conduit 32 closest to the patterning device MA. This need not be the case. For example, the membrane and particle trapping structure may be positioned at the end of the gas conduit 32 which is closest to the intermediate focus IF. Additionally or alternatively, the membrane and particle trapping structure may be located within the source module SO, for example at a position between the collector and the intermediate focus IF. In a further alternative embodiment, the membrane may be such that it forms both part of the illumination system IL (the membrane being intermediate optics within the illumination system and the patterning device) and part of the projection system PS (the membrane also being intermediate optics within the projection system and the patterning device). In this embodiment, the membrane separates the patterning device from both the illumination system and the projection system. The membrane may define, in part, a chamber within which the patterning device is situated. It will be appreciated that in this embodiment, the beam of radiation will pass through the membrane twice: once when it travels from the illumination system to the patterning device and once when it travels from the patterning device to the projection system. The illumination system and projection system may each comprise a chamber which is defined in part by the membrane. The membrane may be provided after the source module SO and before optics of the illumination system IL.

It will also be appreciated that a lithographic apparatus according the present invention may comprise more than one membrane.

A membrane formed from graphene may be provided at any suitable location in the lithographic apparatus. The membrane may for example be configured to stop the passage of contamination particles through the lithographic apparatus.

As previously mentioned, a substance which may be suitable for use in forming the membrane of the present invention may be graphene. Graphene is commonly a planar sheet of carbon atoms in a honeycomb crystal lattice. Graphene shows a high degree of transparency to extreme ultraviolet radiation compared to other solid materials. Due to these properties graphene may also be used to form pellicles or spectral purity filters.

Known pellicles which have been used with EUV radiation include pellicles made from a silicon/rubidium (Si/Ru) material. These materials have been found to be undesirable due to the fact that they are fragile (i.e. not mechanically robust) and they have been found to suffer from substantial transmission losses. Due to the lack of robustness of pellicles made of Si/Ru materials, they are brittle and hence very difficult to handle and locate within a lithographic apparatus. Furthermore, the lack of mechanical robustness of the Si/Ru material may mean that a pellicle formed of this material may not be able to maintain its integrity so as to prevent debris from reaching the reticle, or may not be capable of withstanding the environmental factors within the lithographic apparatus. Such environmental factors may include pressure gradients within the lithographic apparatus and/or changes in temperature. As previously mentioned, Si/Ru materials have been found to suffer from substantially large transmission losses. These transmission losses may be in excess of 50% of the incident EUV radiation. Any transmission losses due to the pellicle will result in less radiation reaching a substrate within the lithographic apparatus. This may result in a reduction of imaging performance of the lithographic apparatus.

Figure 4:
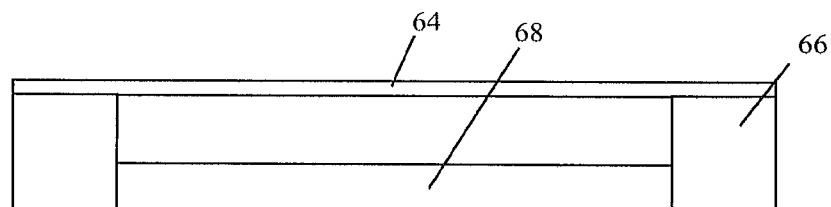
FIG. 4 is a cross sectional view through an embodiment of a reticle which may form part of a lithographic apparatus according to the invention.

FIG. 4 shows a graphene pellicle 64. The pellicle 64 is supported by a pellicle frame 66 which holds the pellicle 64 at a fixed distance from the reticle 68. The reticle 68 lies in the focal plane of the lithographic apparatus and is an example of a patterning device.

The use of a pellicle is known as a way of preventing debris (e.g. contaminant or dust particles) from coming into contact with the reticle. Any debris which comes to rest on the reticle may cause substantial degradation in the imaging performance of the lithographic apparatus because the reticle (and hence the debris in contact with the reticle) is in the focal plane of the lithographic apparatus. As previously stated, the pellicle prevents debris from reaching the reticle. Any debris which comes to rest on the pellicle will not be in the focal plane of the lithographic apparatus and therefore any degradation in the imaging performance of the lithographic apparatus will be much less than if the debris had come to rest on the reticle.

The use of graphene as a pellicle for use with EUV radiation may be particularly advantageous. The pellicle 64 shown in FIG. 4 is a single sheet of graphene. The sheet of graphene is mechanically robust, meaning that it is capable of preventing debris particles from reaching the reticle 68. Furthermore, the graphene sheet pellicle 64 is thought to be capable of transmitting approximately 99% of EUV radiation incident upon it (both at 13.5 nanometers and at 6.7 nanometers). Due to the fact that graphene is formed from single atomic layers of carbon atoms, properties of the graphene are substantially uniform. For example, the thickness and composition of the graphene sheet may be substantially uniform across the entire sheet. This may be advantageous because the optical properties of the pellicle will be substantially the same for any part of the pellicle. This in turn means that all parts of any radiation beam passing through the pellicle will be affected by the pellicle in the same manner. It follows that the pellicle will not affect the patterning of the radiation beam and hence the imaging performance of the lithographic apparatus of which the pellicle forms part may not be detrimentally affected.

In an embodiment, instead of forming the pellicle 64 from a single sheet of graphene, the pellicle is formed from a plurality of graphene layers located on top of one another.

This may provide the pellicle 64 with improved strength and robustness. For example, more than ten graphene layers or more than fifty graphene layers may be used to form the pellicle 64. A pellicle formed from a plurality of graphene layers may have a higher strength than a pellicle formed from a single sheet of graphene. Although the transmission of the pellicle may be reduced if it is formed from a plurality of layers, the pellicle may nevertheless still have a sufficiently high transmission to allow it to be used in an EUV lithographic apparatus. The transmission of 100 layers of graphene may be 85% at 13.5 nanometers and may be 95% at 6.7 nanometers. The thickness of 100 layers of graphene is around 30 nanometers. The pellicle 64 could be formed by stacking together single layers of graphene, or by epitaxially growing a stack of graphene layers.

The use of graphene to form the pellicle 64 has several advantages which include a high mechanical strength, a high degree of uniformity (in terms of both thickness and composition), a high transparency to EUV radiation, and a high degree of thermal stability (i.e. it is substantially unaffected by changes in temperature which may occur within a lithographic apparatus). In addition, graphene is capable of withstanding temperatures of up to around 1500° C. Graphene's mechanical strength avoid the need to support the pellicle using a grid, and thus avoids the non-uniformity of EUV radiation that a grid would introduce. In an embodiment, a grid may be used to provide some support to the graphene.

Graphene's mechanical strength means that the pellicle can be relatively easily handled. For example, a pellicle comprising graphene can be positioned on a support member to which edges of the pellicle are attached, and may then be put in its desired location within the lithographic apparatus. The pellicle may be periodically replaced by removing the support member and pellicle and replacing it with a new support member and pellicle. Graphene also has a substantially flat surface which enables the graphene to be doped (if required) in a uniform matter. Doping the graphene may alter certain properties of the graphene as is well known in the art. In some pellicles, doping the graphene may enable the spectral purity filters to exhibit desirable optical and/or mechanical properties, for example greater radiation transmission and/or greater mechanical strength.

Figure 5:
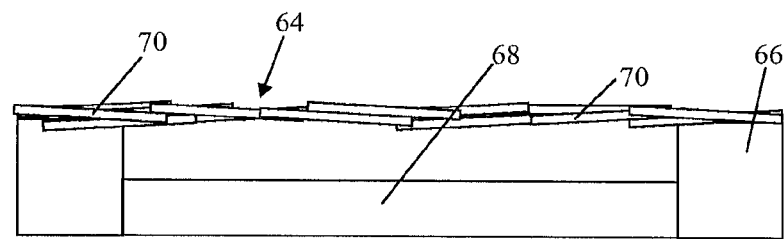
FIG. 5 is a cross sectional view through an embodiment of a reticle which may form part of a lithographic apparatus according to the invention.

FIG. 5 shows a second embodiment of pellicle 64. In this embodiment, the pellicle 64 is not made from a graphene sheet, but rather from an unordered arrangement of graphene flakes which form a layer that constitutes the pellicle 64: The graphene flakes may be of different shapes and sizes (for example they may be up to approximately 100 micrometers size). The graphene flakes are held together by Van der Waals' forces. A pellicle 64 formed from graphene flakes 70 may have a less uniform thickness and a less flat surface than a single sheet of graphene, and may be more reactive to hydrogen and oxygen in the lithographic apparatus because it includes more graphene edges. An advantage of forming the pellicle 64 made from graphene flakes 70 is that it provides a similar performance to the graphene sheet but at a reduced cost.

Figure 6:
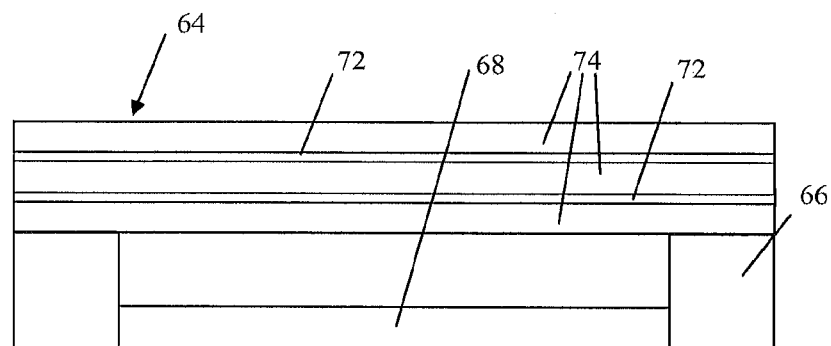
FIG. 6 is a cross sectional view through an embodiment of a reticle which may form part of a lithographic apparatus according to the invention.

The pellicle 64 shown in FIG. 6 comprises two graphene sheets 72 sandwiched between layers of support material 74 such that the pellicle 64 is formed from a stack of alternating layers as follows: support material, graphene sheet, support material, graphene sheet, support material. Using the support material 74 in addition to graphene 72 may provide the advantage that it improves mechanical properties of the pellicle 64. The graphene may act as an anti-diffusion barrier.

It will be appreciated that the support material layers 74 may protect the graphene sheet from other environmental factors within the lithographic apparatus, such as temperature and mechanical stress. In some embodiments, it may be desirable that the layers of support material allow a significant amount of EUV radiation to pass through them. It will also be appreciated that although embodiment of the pellicle 64 shown in FIG. 6 comprises two graphene sheets sandwiched between the support material layers 74, any number of graphene sheets 72 and support material layers 74 may be used. In addition, in the place of the graphene sheets 72, graphene flakes (as described above) may also be used.

It is conceivable that a pellicle may comprise a material layer onto which a layer of graphene or graphene flakes has been provided.

Graphene may also be used in the construction of spectral purity filters. Known radiation sources within lithographic apparatus, such as laser produced plasma (LPP) sources, may produce in-band radiation (which may be used to pattern the substrate) and out-of-band radiation. The in-band radiation may for example be extreme ultraviolet (EUV) radiation, whereas the out-of-band radiation may be infrared radiation. Infrared radiation has a wavelength in the range of approximately 0.8 to approximately 1000 µm. For example, infrared radiation may have a wavelength of approximately 10 µm. The out-of-band radiation may be reflected by the same reflectors which direct the in-band radiation to the substrate. It may be undesirable that the out-of-band radiation is reflected by the lithographic apparatus onto the substrate because the out-of-band radiation may have a detrimental effect on the substrate. For example, in the case where the out-of-band radiation is infrared radiation, the infrared radiation may cause the substrate to be heated. Heating of the substrate may cause the substrate to expand. Expansion of the substrate may result in reduced imaging performance of the lithographic apparatus. For example, successive exposures of the substrate to the radiation beam may not align with one another. This may be referred to as an overlay problem. Alternatively, in the case where the in-band radiation is EUV radiation, the out-of-band radiation may be deep ultraviolet (DUV) radiation. DUV radiation may also cause a reduction in imaging performance of the lithographic apparatus. For example the DUV radiation may cause a pattern formed imaged onto a substrate to be blurred.

Spectral purity filters are a known way of suppressing the transmission of out-of-band radiation (for example infrared and/or DUV radiation) through the lithographic apparatus to the substrate. Known spectral purity filters suffer from the fact that the materials which are used to prevent the transmission of the out-of-band radiation (i.e. by absorption and/or reflection) also prevent the transmission of useful in-band EUV radiation. Because the amount of absorption of the in-band radiation by the spectral purity filter increases with increasing thickness of the spectral purity filter, known spectral purity filters for use with EUV radiation are thin (50 to 100 nanometers thick) so as to minimize EUV radiation absorption. Due to the fact that these spectral purity filters are so thin, they may be very fragile (i.e. they have a low mechanical strength). It is therefore very difficult to handle and position such spectral purity filters within the lithographic apparatus. Furthermore, despite minimizing the thickness of known spectral purity filters, the transmission of EUV radiation through a known spectral purity filter may be less than about 50%. The low transmission of the EUV radiation through such spectral purity filters may be undesirable because a reduced intensity of EUV radiation reaching the substrate may result in reduced imaging performance of the lithographic apparatus.

Figure 7:
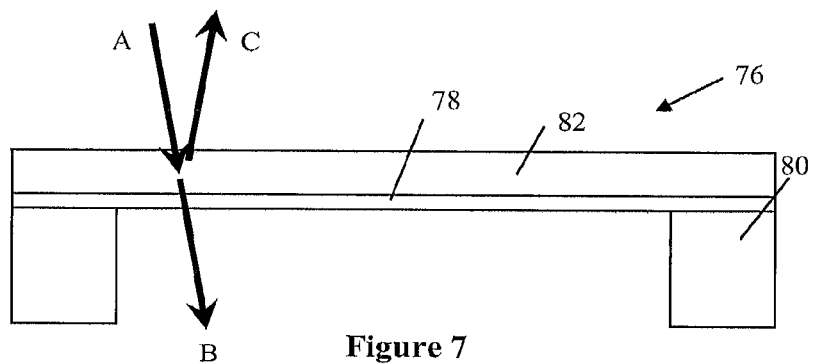
FIG. 7 is a cross sectional view through an embodiment of a spectral purity filter which may form part of a lithographic apparatus according to the invention.

As previously discussed, graphene is a material which has a high mechanical strength and also permits substantial EUV radiation to be transmitted through it. FIG. 7 shows a spectral purity filter 76 which includes a graphene sheet 78. The graphene sheet 78 is disposed upon a spectral purity filter frame 80. The graphene sheet 78 supports an out-of-band radiation suppression structure 82. The out-of-band radiation suppression structure 82 may comprise a single or multi-layered structure which is capable of suppressing the transmission of out-of-band radiation through the spectral purity filter. FIG. 7 shows a radiation beam A which is incident on the spectral purity filter. The incident radiation beam may comprise both in-band radiation and out-of-band radiation. The in-band radiation B passes through the out-of-band radiation suppression structure 82 and graphene sheet 78 and may then pass to the patterning device and hence the substrate. The out-of-band radiation may be absorbed by the out-of-band suppression structure 82 (absorption of out-of-band radiation not shown) or may be reflected away from the spectral purity filter 76 as indicated by C. The graphene sheet 78 acts to support the potentially thin out-of-band radiation suppression structure 82 and therefore makes the spectral purity filter easier to handle and locate within a lithographic apparatus. In addition, the graphene may also prevent oxidation of the out-of-band radiation suppression structure 82, since graphene is impermeable to oxygen. Both sides of the out-of-band radiation suppression structure 82 may be covered with graphene if it is desired to prevent oxidation of the out-of-band radiation suppression structure.

Figure 8:
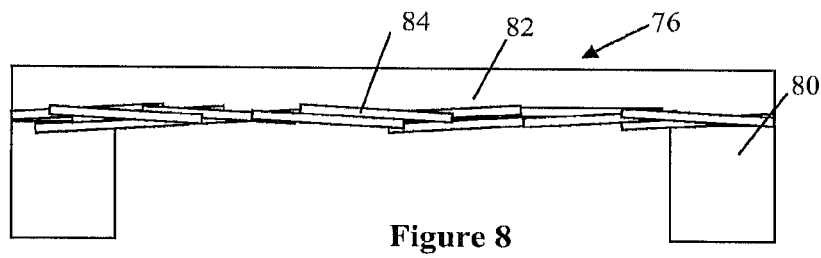
FIG. 8 is a cross sectional view through an embodiment of a spectral purity filter which may form part of a lithographic apparatus according to the invention.

FIG. 8 shows a similar spectral purity filter to that shown in FIG. 7. In this embodiment, the graphene sheet 78 of the spectral purity filter shown in FIG. 7 is replaced by graphene flakes 84. The graphene flakes 84 may be in an unordered arrangement which forms a layer in which different shapes and sizes of flake are attached to one another within the layer via Van der Waals' forces. In some spectral purity filters graphene flakes may be advantageous compared to graphene sheets. This is because graphene flakes may be less expensive than graphene sheets, and may be easier to process.

The spectral purity filter may for example comprise a grid which has a pitch that is smaller than the wavelengths of radiation that it is intended to block. For example, the grid may have a pitch of around 5 microns and may be used to block infrared radiation having a wavelength greater than around 10 microns. The grid may for example be formed from hexagonal cells, e.g. having a honeycomb grid form. Ribs which form the hexagonal cells may for example be around 500 nanometers thick. The grid may for example be formed from a metal such as tungsten which is capable of withstanding the substantial heat load generated by infrared radiation and which has a high emissivity. The outer surface of the tungsten grid will oxidize to form tungsten oxide when it is in the atmosphere, for example during construction of an EUV lithographic apparatus. When the EUV lithographic apparatus is operating, tungsten oxide will evaporate from the grid when it is exposed to infrared radiation. Some of the tungsten oxide may accumulate on optical surfaces of the EUV lithographic apparatus, decreasing their reflectivity and thereby decreasing the intensity of EUV radiation available for projection onto a substrate. Conventional cleaning techniques are not capable of removing tungsten oxide from the optical surfaces. It is therefore desirable to prevent tungsten oxide from the grid contaminating the EUV lithographic apparatus.

Figure 9:
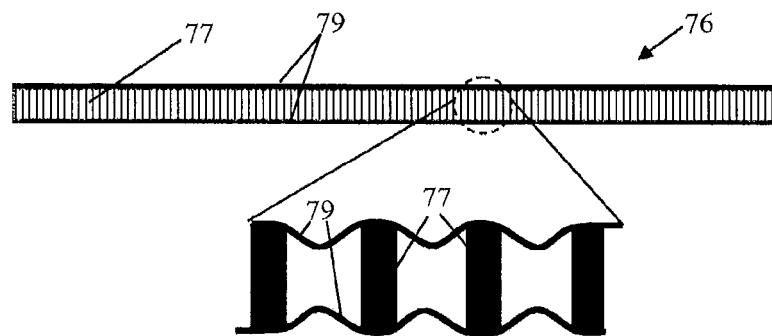
FIG. 9 is a cross sectional view through an embodiment of a spectral purity filter which may form part of a lithographic apparatus according to the invention.

Graphene may be used to protect the tungsten grid from oxidation and/or to prevent out-gassing of tungsten oxide from the grid. FIG. 9 shows schematically in cross-section an embodiment in which a spectral purity filter 76 comprises a tungsten grid 77 (or grid formed from some other suitable metal), a layer of graphene 79 being provided on either side of the grid. The graphene may be applied such that none of the tungsten grid 77 is exposed. The graphene layers 79 are not permeable to oxygen, and therefore will prevent oxidation of the tungsten grid 77. The graphene layers 79 may for example be applied as sheets of graphene to the tungsten grid 77. This may be done when the tungsten grid is in a vacuum (e.g. when a layer of tungsten oxide is not present on the tungsten grid). Once the graphene layers 79 are in place the spectral purity filter 76 may be exposed to the atmosphere. The graphene layers 79 prevent oxidation of the tungsten grid 77 and therefore prevent a layer of tungsten oxide from building up on the tungsten grid.

The graphene layers 79 may seal cells which comprise the grid (e.g. hexagonal cells in the case of a honeycomb structure). As a consequence of this, the pressure within the cells may be significantly different from the pressure outside of the cells. For example, there may be a vacuum within the cells and atmospheric pressure outside of the cells. The graphene layers 79 will be sufficiently strong to withstand forces arising from these pressure differences (a single atomic sheet of graphene can hold a pressure difference of vacuum to the atmosphere over a 5 micron pitch grid). The graphene layers 79 may bend inwards as a result of the pressure difference, as is represented schematically in FIG. 9.

Figure 10:
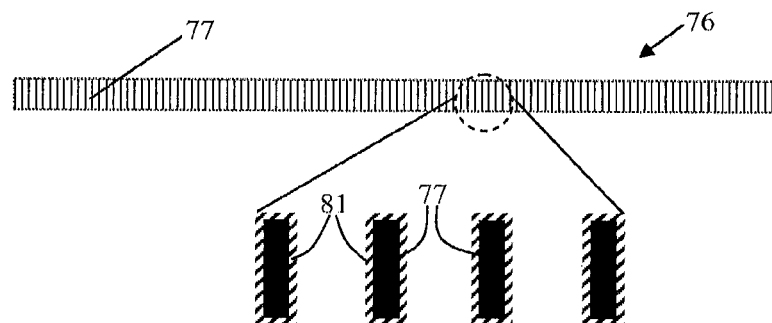
FIG. 10 is a cross sectional view through an embodiment of a spectral purity filter which may form part of a lithographic apparatus according to the invention.

In an alternative embodiment, shown schematically in FIG. 10, instead of providing graphene layers on either side of a tungsten grid, graphene is used to surround individual ribs of the grid. The spectral purity filter 76 comprises a grid 77 formed from tungsten (or some other suitable metal), each rib of the grid being surrounded by graphene 81. The graphene 81 is applied such that none of the tungsten grid 77 is exposed to the atmosphere, and therefore prevents oxidation of the tungsten grid and prevents a layer of tungsten oxide from building up on the tungsten grid.

The embodiment shown in FIG. 10 may for example be made by sputtering graphene flakes onto the grid 77. Alternatively, a sheet of graphene may be placed on top of the grid 77 and then broken up by blowing air onto it such that the graphene breaks up and adheres to ribs of the grid.

Tungsten grid spectral purity filters may have a limited lifetime. A primary reason for the limited lifetime is that tungsten grain forms when the grid is at high temperatures (which will occur during operation of the lithographic apparatus). The tungsten grain causes the grid to become fragile such that it may eventually break.

In an embodiment, the formation of tungsten grain in a spectral purity filter grid may be prevented or reduced by constructing the grid as a tungsten/graphene multi-layered structure. The graphene in such a multi-layered structure acts as a barrier which prevents the formation of large tungsten grains. The graphene does not have a significant effect upon properties of the tungsten such as the tungsten melting temperature. An example of a spectral purity filter 76 comprising a grid formed from ribs 77 which comprise a tungsten/graphene multi-layered structure is shown schematically in FIG. 11. The thickness of the tungsten layers of the spectral purity filter may be smaller than the width of the ribs 77 in order to limit the formation of tungsten grains such that they cannot have a size which exceeds the width of the ribs. For example, the ribs may be 500 nanometers thick. The tungsten layers may be 100 nanometers thick or less, and may be 50 nanometers thick or less. The graphene layers may for example be less than 1 nanometer thick.

A multi-layered grid structure comprising graphene and some other suitable material (e.g. some other suitable metal such as Rhenium) may be used to form the spectral purity filter.

In an embodiment, instead of using a multi-layered structure to form the spectral purity filter grid, the grid may be formed from a mixture of graphene and tungsten. This may be achieved for example by mixing graphene with tungsten and then sputtering the graphene and tungsten together onto an optical component (e.g. an optical component of an EUV lithographic apparatus). Forming the spectral purity filter grid from a mixture of graphene and tungsten may help to reduce the formation of tungsten grains. It may be desirable to use more tungsten than graphene in order to retain desirable properties of tungsten such as good heat resistance and high emissivity. The proportion of graphene to tungsten may be relatively low, for example 5% or lower, and may be 1% or lower.

A mixture of graphene and some other suitable material (e.g. some other suitable metal) may be used in an equivalent manner to form the spectral purity filter.

In some instances, tungsten grains may become detached from the grid 77 and may cause contamination in the EUV lithographic apparatus. Graphene may be used to cover the grid 77 or surround constituent parts of the grid, for example as shown in FIGS. 9 and/or 10. Where this is done the graphene may act as a barrier which prevents tungsten grains from contaminating the EUV lithographic apparatus.

Figure 12:
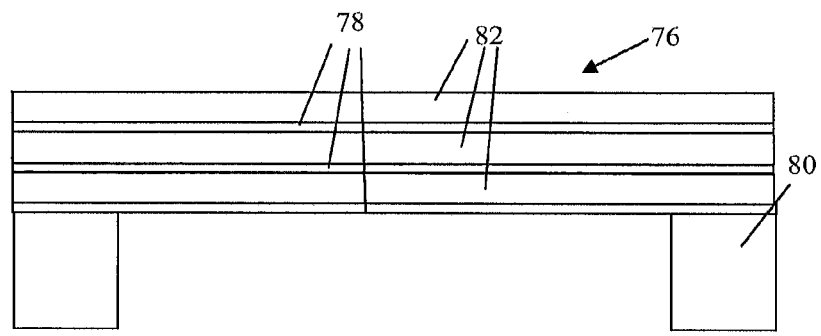
FIG. 12 is a cross sectional view through an embodiment of a spectral purity filter which may form part of a lithographic apparatus according to the invention.

FIG. 12 shows an embodiment which comprises a spectral purity filter with a multi-layered structure. This spectral purity filter comprises six alternating layers: three graphene sheet layers 78 and three out-of-band radiation suppression structure layers 82. This spectral purity filter can therefore be likened to a stack of three spectral purity filters which are shown in FIG. 7. This embodiment may be advantageous compared with the embodiment shown in FIG. 7 because a large total thickness of out-of-band radiation suppression layers 82 can be supported by a plurality of graphene sheet layers 78. Due to the fact that multiple graphene sheet layers 78 are provided amongst the out-of-band radiation suppression structure layers 82, the spectral purity filter may have a greater mechanical strength compared to a spectral purity filter with a single out-of-band radiation suppression layer and a single graphene sheet layer. It will be appreciated that within this embodiment the graphene sheet layer 78 may be replaced with layers made out of graphene flakes as described above.

An advantage of strengthening a spectral purity filter using graphene (e.g. in the manner shown in FIG. 12) is that it does not significantly change the high emissivity of the spectral purity filter. High emissivity of the spectral purity filter is useful because it allows the spectral purity filter to radiate heat efficiently and therefore allows the spectral purity filter to stay at a lower temperature during operation of the lithographic apparatus than would otherwise be the case.

Figure 13:
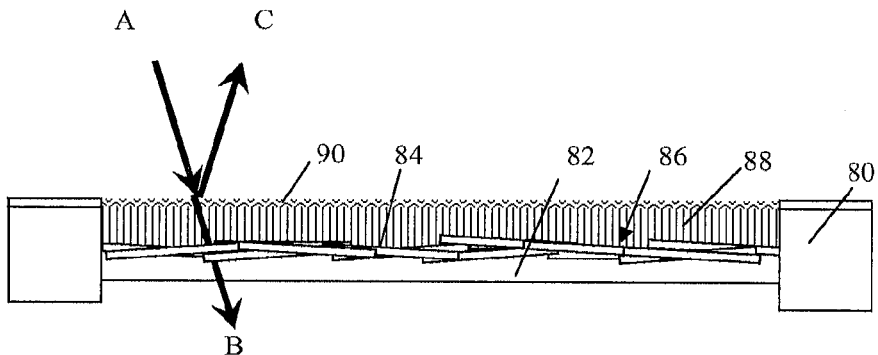
FIG. 13 is a cross sectional view through an embodiment of a spectral purity filter which may form part of a lithographic apparatus according to the invention.
Figure 14:
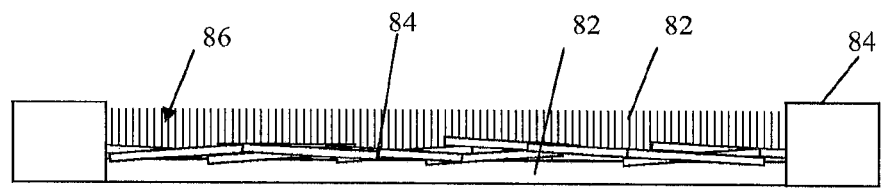
FIG. 14 is a cross sectional view through an embodiment of a spectral purity filter which may form part of a lithographic apparatus according to the invention.

FIGS. 13 and 14 show further spectral purity filters which comprise a support layer formed from graphene flakes 84. In both cases, the layer of graphene flakes 84 is disposed upon the out-of-band radiation suppression structure 82. Disposed upon the layer formed from graphene flakes 84 is a grid structure 86. The pitch of the grid may be chosen to substantially prevent transmission of out-of-band radiation (for example infrared radiation) as explained further above. The pitch of the grid may for example be 5 microns.

The grid 86 of the spectral purity filter shown in FIG. 13 comprises a support structure 88 (made for example from tungsten) and a reflective coating 90 which is reflective to out-of-band radiation. An example of a coating which may be used in the case where the out-of-band radiation is infrared radiation (for example at 10.6 µm) is molybdenum (Mo). The reflective coating 90 may act together with the pitch of the grid to block infrared radiation.

Figure 11:
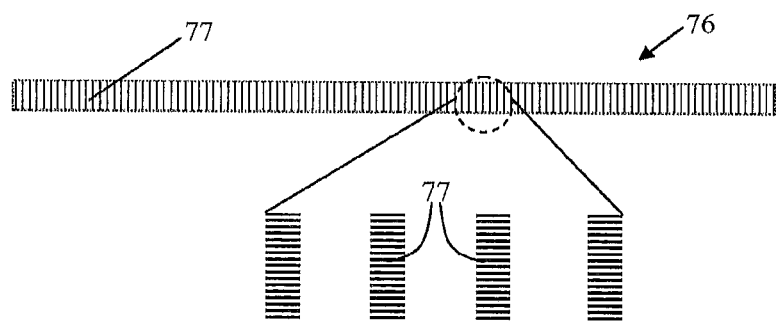
FIG. 11 is a cross sectional view through an embodiment of a spectral purity filter which may form part of a lithographic apparatus according to the invention.

The grid structure of the spectral purity filter shown in FIG. 11 is made from a material which is reflective to the out-of-band radiation. In the case where the out-of-band radiation is infrared radiation (for example at 10.6 µm), an example of a material which is reflective to out-of-band radiation is a metal with high conductivity. Examples of such metals include Al, Au, Ag and Cu.

It will be appreciated that a spectral purity filter structure similar to that shown in FIG. 12 may be utilized in combination with a grid structure which reflects out-of-band radiation (or which absorbs out-band radiation but does not transmit it). This may be useful for example in an LPP radiation source, in which a substantial amount of infrared radiation may be present. A spectral purity filter similar to that shown in FIG. 12 may be utilized without a grid structure an a DPP radiation source, where there may be little or no infrared radiation. For example, a grid structure which prevents transmission of out-of-band radiation may be placed on top of the spectral purity filter shown in FIG. 12. One possible embodiment of such a spectral purity filter comprises a grid with a spacing of 5 µm (the grid suppressing out-of-band infrared radiation having a wavelength of 10.6 µm). The spectral purity filter also comprises three graphene layers, each graphene layer being a graphene sheet which is three layers of graphene thick (thickness of one layer of graphene is approximately 0.34 nm, therefore the thickness of a sheet of graphene which is three layers thick is approximately 1 nm). The spectral purity filter further comprises three out-of-band radiation suppression layers made from silicon, zirconium or molybdenum, each having a thickness of approximately 3 nm. In other embodiments the spectral purity filter may comprise four or more (or two) graphene layers and out of band suppression layers. Each graphene layer may comprise four or more (or two) sheets of graphene.

Features of the spectral purity filter embodiments described above may be combined. For example a tungsten grid in which constituent parts are surrounded by graphene (e.g. as shown in FIG. 10) may be provided with an outer layer of molybdenum to provide increased reflectivity of out-of band radiation.

It will be appreciated that the out-of-band radiation suppression structure may comprise any material which is capable of absorbing and/or reflecting out-of-band radiation whilst at the same time allowing transmission of in-band radiation. Examples of materials which may be used include tungsten (W), silicon (Si) and zirconium (Zr).

Graphene may be used when constructing multi-layer mirrors, for example multi-layer mirrors used in EUV lithographic apparatus. Multi-layer mirrors are formed from a plurality of alternating layers of a metal such as molybdenum or tungsten, and a spacer such as silicon, the layers being formed on a substrate which provides structural support. The thicknesses of layer pairs may be equal to half the wavelength of radiation to be reflected (e.g. EUV radiation at 13.5 nm). Constructive interference of radiation scattered from each layer pair causes the multi-layer mirror to reflect the radiation.

It is desirable in a multi-layer mirror to provide well defined boundaries between adjacent layers (e.g. between a layer of molybdenum and a layer of silicon). Over time diffusion may occur between adjacent layers such that the boundaries between them become less well defined. The diffusion may in part be due to the mirrors being heated during operation of the lithographic apparatus. Graphene may be used as an anti-diffusion layer located between adjacent layers, the graphene acting to maintain well defined boundaries between the adjacent layers.

Graphene is suited to use as an anti-diffusion layer because it is non-permeable and may be provided in a thin layer (e.g. less than 1 nm thick) such that it absorbs very little EUV radiation. Because graphene is able to withstand high temperatures (e.g. up to around 1500° C.) it may allow multi-layer mirrors to withstand higher temperatures than conventional multi-layer mirrors. Conventional multi-layer mirrors may for example become damaged at temperatures of around 100° C. If a spectral purity filter in an EUV lithographic apparatus were to fail, then infrared radiation incident upon multi-layer mirrors of the lithographic apparatus may quickly heat the multi-layer mirrors to more than 100° C., causing damage to the multi-layer mirrors such that they must be replaced. By using graphene to increase the maximum temperature which multi-layer mirrors are able to withstand, the likelihood of damage to multi-layer mirrors due to overheating is reduced.

Using graphene to allow multi-layer mirrors to withstand higher temperatures than conventional multi-layer mirrors may allow multi-layer mirrors to be used in locations in which they would conventionally not be used. For example, multi-layer mirrors may be used before the spectral purity filter. For example a multilayer mirror (or mirrors) may be used as a collector in the EUV radiation source SO.

Figure 15:
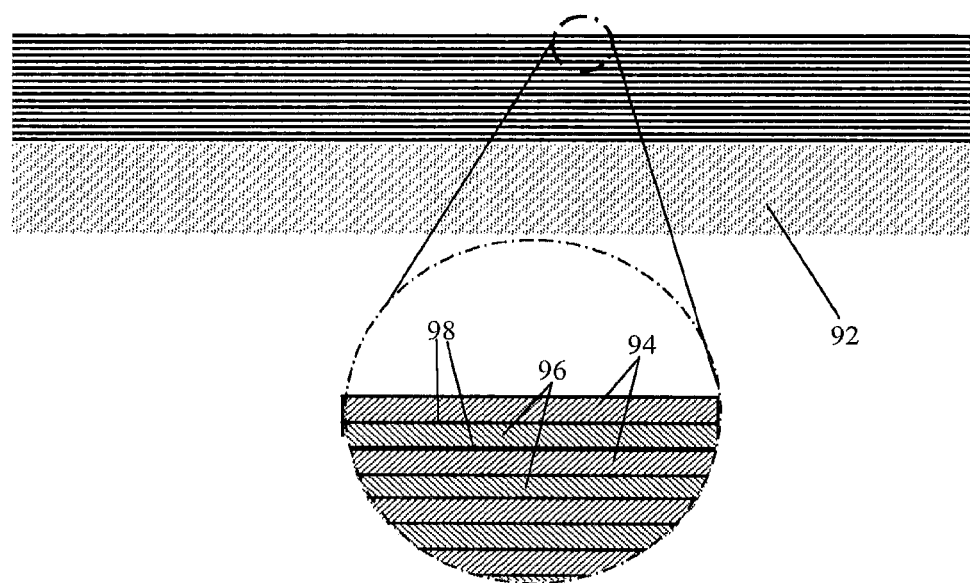
FIG. 15 is a cross sectional view through an embodiment of a multi-layer mirror which may form part of a lithographic apparatus according to the invention.

An embodiment of a multi-layer mirror is shown schematically in FIG. 15. The multi-layer mirror comprises a substrate 92 upon which alternating layers of molybdenum 94 and silicon 96 (or other suitable materials) are provided. A layer of graphene 98 is provided between each layer of molybdenum 94 and silicon 96. The layer of graphene may for example be less than 1 nm thick, or may have some other thickness.

The multi-layer mirror may for example be constructed by growing a layer of molybdenum or silicon onto the substrate (e.g. using chemical vapour deposition), manually applying a sheet of graphene onto the layer, growing the next layer, etc.

It is conventional to provide a layer of ruthenium on the outermost layer of a multi-layer mirror in order to prevent oxidation of the outer layers of the multi-layer mirror. The ruthenium layer will oxidise spontaneously when it is exposed to the atmosphere, and will also oxidise during operation of the EUV lithographic apparatus. This oxidation may reduce the reflectivity of the mirror by around 1%, which may be sufficient to give rise to a significant loss of EUV radiation intensity in the lithographic apparatus (the loss is cumulative for each mirror of the apparatus). The oxidation can be removed from the mirror by cleaning using hydrogen ions. However, a residue may be left behind on the mirror which cannot be removed during cleaning. The residue will build up on the mirror over time, thereby reducing the lifetime of the mirror.

In an embodiment, a layer of graphene may be provided as the outermost layer of the multi-layer mirror instead of the layer of ruthenium (or other capping layer). The graphene will prevent oxidation of the outer layers of the multi-layer mirror because it is non-permeable for oxygen.

Using graphene in a multi-layer mirror (either between layers on top of the outermost layer) is advantageous because the graphene may be provided with a uniform thickness (e.g. as a single layer) and may thus not distort radiation reflected by the mirror. The same advantage may apply to the graphene layers provided on either side of a spectral purity filter (see FIG. 9).

Graphene provides the advantage that it may be provided as a very thin layer (e.g. 0.34 nanometers for a single layer), in which case it is highly transparent to EUV radiation (e.g. around 99.8% transparent for a thickness of 0.34 nanometers). Furthermore, graphene is stable when heated to temperatures which may occur in an EUV lithographic apparatus. A further advantage is that graphene is widely available and may be applied over relatively large surface area.

Another advantage of graphene is that it is chemically resistant to hydrogen ions, therefore allowing cleaning within an EUV lithographic apparatus to be performed without the graphene being damaged. Graphene also has the advantage, compared with Ruthenium, that tin and zinc do not adhere to it. When cleaning is performed using hydrogen ions, tin and zinc may tend to adhere to a Ruthenium outer layer of a mirror (the tin and zinc coming from other parts of the lithographic apparatus). This may form a residue which cannot easily be removed. This may limit the lifetime of the mirror because it may become less reflective over time. However, tin and zinc do not tend to stick to graphene. The build-up of residue on the mirrors may therefore be avoided, and the lifetime of the mirror may be extended.

Although graphene is referred to above, graphene derivatives may be used in mirrors, spectral purity filters, etc. of an EUV lithographic apparatus. Graphene derivatives include for example graphane, graphene fluoride, graphene bromide, graphene chloride and graphene iodide. Graphene and graphene derivatives have in common that they are all membranes which have carbon SP2 bonded bases. The mechanical properties of graphene derivatives may be the same or similar to the mechanical properties of graphene, although the chemical properties may be different. Graphene fluoride may provide the advantage that it has bonds which are less susceptible than graphene bonds to breaking when illuminated by EUV radiation. For this reason, graphene fluoride may be used in embodiments of the invention instead of graphene.

Graphene may comprise a single layer of SP2 bonded carbon, or may comprise a plurality of layers of SP2 bonded carbon stacked together, or a plurality of layers of predominantly SP2 bonded carbon stacked together.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A pellicle module constructed and arranged for an EUV reticle, the pellicle module comprising:
   a pellicle frame, configured and arranged to hold a pellicle at a fixed distance from the EUV reticle; and
   wherein the pellicle comprises a layer of graphene.

2. The pellicle according to claim 1, wherein the layer of graphene is formed from a single atomic layer of carbon.

3. The pellicle according to claim 1, wherein the pellicle comprises a plurality of graphene layers.

4. The pellicle according to claim 1, wherein the pellicle comprises graphene flakes.

5. The pellicle according to claim 1, wherein the pellicle comprises a grid to support the graphene.

6. The pellicle according to claim 1, wherein the pellicle does not comprise a grid.

7. The pellicle according to claim 1, wherein the pellicle is doped.

8. The pellicle according to claim 1, wherein the pellicle comprises a support member configured to be removable from a lithographic apparatus and/or the reticle.

9. The pellicle according to claim 1, wherein the pellicle comprises alternating layers of graphene and supporting material.

10. The pellicle according to claim 1, wherein the graphene is configured to function as an anti-diffusion barrier.

11. The pellicle according to claim 1, wherein the graphene comprises graphene derivatives.

12. The pellicle according to claim 11, wherein the graphene derivatives are selected from the group consisting of: graphane, graphene fluoride, graphene bromide, graphene chloride and graphene iodide.

13. A lithographic apparatus comprising:
   a radiation source configured to produce a radiation beam and a support configured to support a patterning device, the patterning device being configured to impart the radiation beam with a pattern to form a patterned radiation beam; wherein the support is provided with a pellicle comprising a layer of graphene.

* * * * *